United States Patent
Yoshida (10) Patent No.: US 7,537,990 B2
(45) Date of Patent: May 26, 2009

(54) METHOD OF MANUFACTURING SEMICONDUCTOR DEVICES

(75) Inventor: Kazuyoshi Yoshida, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 26 days.

(21) Appl. No.: 11/902,917

(22) Filed: Sep. 26, 2007

(65) Prior Publication Data

US 2008/0076250 A1    Mar. 27, 2008

(30) Foreign Application Priority Data

Sep. 27, 2006    (JP) .............................. 2006-261823

(51) Int. Cl.
  *H01L 21/8238*    (2006.01)
(52) U.S. Cl. .................. 438/229; 438/299; 438/689
(58) Field of Classification Search ................. 438/689, 438/229, 299
See application file for complete search history.

(56) References Cited

U.S. PATENT DOCUMENTS

| | | | |
|---|---|---|---|
| 6,080,681 A | 6/2000 | Tabara | |
| 6,271,125 B1 * | 8/2001 | Yoo et al. | 438/637 |
| 6,368,974 B1 * | 4/2002 | Tsai et al. | 438/695 |
| 7,030,029 B2 * | 4/2006 | Tsuchiya | 438/714 |
| 2005/0118829 A1 * | 6/2005 | Lee et al. | 438/714 |
| 2006/0028855 A1 * | 2/2006 | Matsunaga et al. | 365/145 |

FOREIGN PATENT DOCUMENTS

| | | |
|---|---|---|
| JP | 9-134888 | 5/1997 |
| JP | 10-321724 | 12/1998 |
| JP | 11-214358 | 8/1999 |
| JP | 2003-158179 | 5/2003 |

* cited by examiner

*Primary Examiner*—Thao X Le
*Assistant Examiner*—Eric W Jones
(74) *Attorney, Agent, or Firm*—McGinn IP Law Group, PLLC (57) ABSTRACT

A method of manufacturing semiconductor devices includes: preparing a semiconductor substrate over which a laminated structure including an insulating layer is formed; forming over the insulating layer a resist mask including a first opening and a second opening which is greater in width than the first opening; first etching using the resist mask to form a hole which corresponds to the first opening and penetrates the insulating layer and to form a first trench which corresponds to the second opening and is shallower than the hole; forming a deposition film so as to fill the hole; second etching to etch back the deposition film so that the insulating layer is exposed in the first trench and that the deposition film remains in the hole; and third etching using the resist mask and the remaining deposition film for masking to remove the insulating layer part exposed in the first trench so as to form a second trench penetrating the insulating layer.

22 Claims, 10 Drawing Sheets

METHOD OF MANUFACTURING SEMICONDUCTOR DEVICES

BACKGROUND OF THE INVENTION

1. Field of the Invention

The present invention relates to a method of manufacturing semiconductor devices.

2. Description of the Related Art

In a semiconductor device such as a DRAM, a contact plug passing between wirings close to each other is formed by the following process.

First, an electroconductive film is patterned using a silicon nitride film as a mask to form wirings. Then, a silicon nitride film is so formed as to cover the wirings, followed by etching back. As a result, the upper part of the wirings and side walls are covered by the silicon nitride film. Next, an inter-layer insulating film is so formed as to bury the wirings and is flattened. Then, a resist mask is formed by lithography, and dry etching of a high etching selection ratio between the silicon nitride film and the inter-layer insulating film is performed by using this mask to form a contact hole. An electric conductor is buried in this contact hole to form a contact plug in this hole.

This method, known as self-aligned contact (SAC), is in general use. In recent years, however, along with the miniaturization of semiconductor patterns, it has become difficult to satisfy the requirement for a sufficiently high etching selection ratio between the silicon nitride film and the inter-layer insulating film at the time of contact hole formation. Accordingly, it has become difficult to form contact holes by using the SAC technique.

Where a contact hole is to be formed without using the SAC method, a technique in which the contact plug is ensured to be formed not to come into contact with wiring is required. The present inventor has taken note of a technique by which contact holes of a small bore are formed.

By setting the bore of a contact plug arranged between wirings to be set smaller, the allowance of positioning in the process of contact hole formation can be increased. The bore of the contact hole is so set that the contact plug does not come into contact with any one of the wirings even if a displacement, which may occur in the manufacturing process, does occur. Possible causes for such a displacement which may occur in the manufacturing process include a positioning margin for the wirings in lithography, variations in aperture size and variations in the size of the wiring s. For instance where the wiring pitch is 190 nm and the space between wirings is 140 nm, it is desirable for the contact hole bore to be set to no more than 100 nm.

On the other hand, lithography may be carried out by performing superimpose and alignment after a process to fabricate such a minute contact plug. For this reason, in a semiconductor device having a minute contact plug, a large trench of 1 μm or more in width is formed for the aligning purpose.

Thus, in a technique of forming a small-diameter contact plug without using the SAC method, it is required to form patterns extremely unequal in area (contact holes of 100 nm or less in bore and a trench of 1 μm or more in width) on the same semiconductor substrate.

As an example of technique for forming patterns unequal in area, a method by which contact holes differing in diameter are formed is described in Japanese Patent-Laid-Open No. 10-321724 (Patent Document 1). According to this method, together with a self-aligned contact hole, a contact hole larger in bore than that of the self-aligned contact hole is formed. This method will be described below with reference to FIGS. 1A through 1D.

Figure 1A:
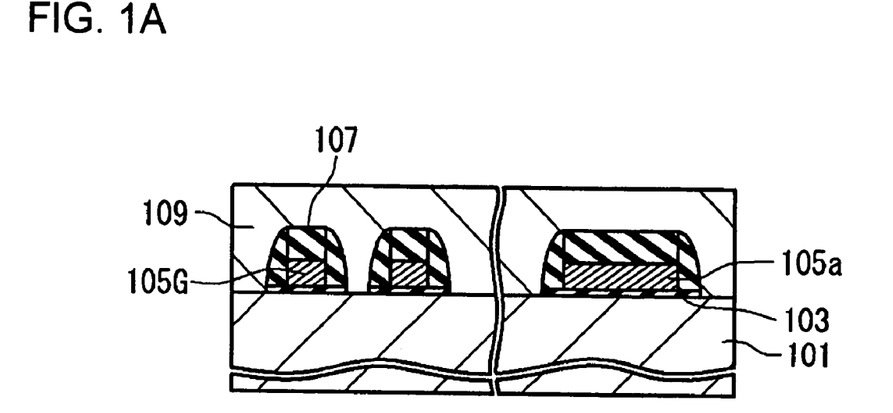
FIG. 1A illustrates a method of forming a contact hole in the related art.

First, a sectional structure shown in FIG. 1A is formed. In this sectional structure, gate electrodes 105G of the memory cell part and first wiring layer 105a of a peripheral circuit part disposed on a p-type silicon substrate 101 are covered by SiN film 107, and further covered by BPSG film 109.

Figure 1B:
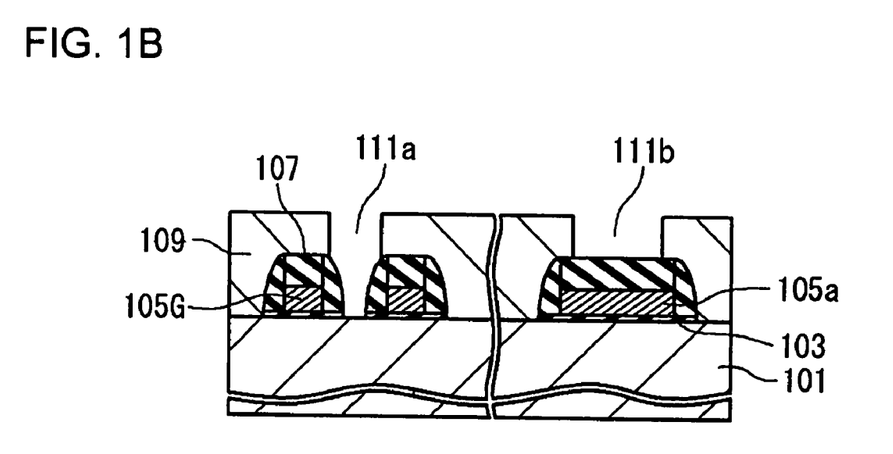
FIG. 1B illustrates the step following the step of FIG. 1A.

Next, as shown in FIG. 1B, the BPSG film is selectively etched by using a patterned resist mask. Contact hole 111a reaching the substrate by self-aligned contact (SAC) is formed between gate electrodes 105G, and contact hole 111b for first wiring layer 105a is formed in the peripheral circuit part. Where the bore of contact hole 111a is about 0.15 μm, it is described that the bore of contact hole 111b to be about 0.45 μm is desirable.

Figure 1C:
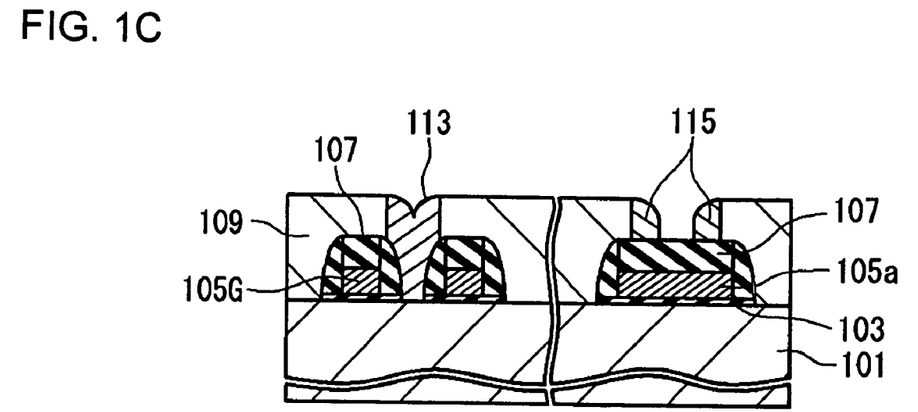
FIG. 1C illustrates the step following the step of FIG. 1B.

Then, a doped silicon layer is formed by low pressure CVD. By the formation of this layer, narrow contact hole 111a is filled with the doped silicon layer but wide contact hole 111b for the first wiring layer is not filled with it. Next, as shown in FIG. 1C, the doped silicon layer over the flat part is removed by anisotropic etching. Plug 113 is formed in the contact hole 111a reaching the substrate. Side wall 115 is formed in contact hole 111b for the first wiring layer.

Figure 1D:
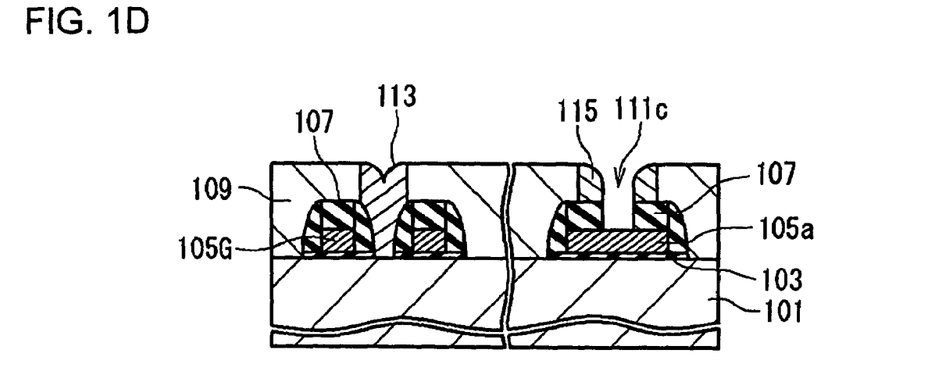
FIG. 1D illustrates the step following the step of FIG. 1C.

Then, as shown in FIG. 1D, SiN film 107 over first wiring layer 105a is dry-etched and contact hole 111c reaching the first wiring layer is formed in a self-aligned manner.

According to this technique, even if miniaturization by SAC is carried out in the memory cell part, no further step is required to form a contact hole reaching the first wiring layer of the peripheral circuit part.

In the technique described in Patent Document 1, contact holes of different bores are formed. In the example cited above, the contact hole bores are 0.15 μm and 0.45 μm.

Japanese Patent Laid-Open No. 2003-158179 (Patent Document 2) discloses a technique featuring the formation of alignment marks. This technique will be described with reference to FIGS. 2A through 2F.

Figure 2A:
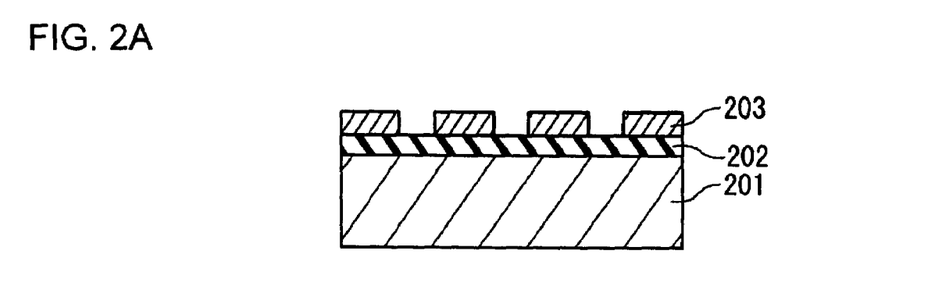
FIG. 2A illustrates a method of forming alignment marks in the related art.

First, as shown in FIG. 2A, silicon nitride film 202 is formed on the surface of silicon substrate 201, and resist pattern 203 is formed on the film by photolithography.

Figure 2B:
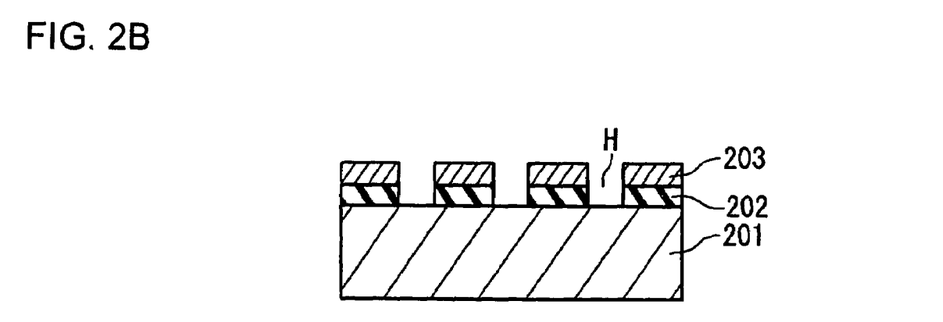
FIG. 2B illustrates the step following the step of FIG. 2A.

Then, as shown in FIG. 2B, etching is carried out with resist pattern 203 as a mask, and first mask 202 made up of a silicon nitride film having openings H in the area of trench formation is formed.

Figure 2C:
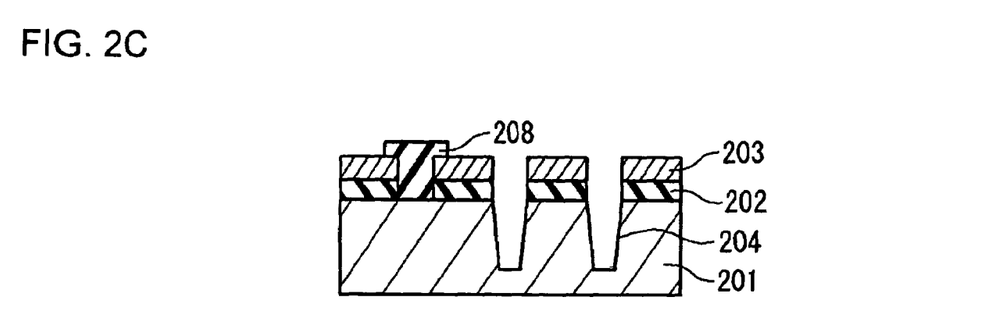
FIG. 2C illustrates the step following the step of FIG. 2B.

Next, a silicon nitride film is formed and patterned by photolithography and etching to form second mask 208 that is so formed as to cover the vicinity of the opening corresponding to the area for alignment mark formation out of openings H. Then, as shown in FIG. 2C, plasma etching is carried out through these second mask 208 and first mask 202 to form trench 204 for element isolation.

Figure 2D:
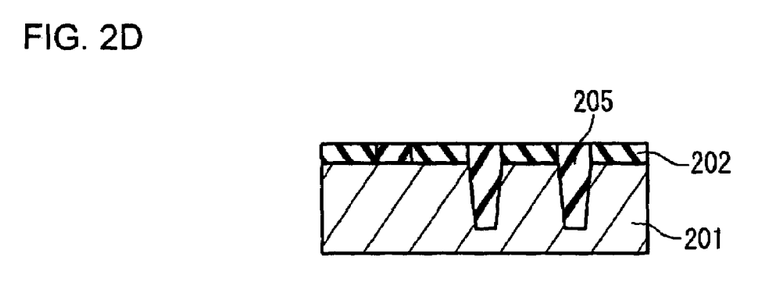
FIG. 2D illustrates the step following the step of FIG. 2C.

Next, second mask 208 is peeled off and removed. Then, a silicon oxide film is formed by CVD so as to fill trench 204 with silicon oxide film 205. At this step, the silicon oxide film is also formed in the area for alignment mark formation where second mask 208 was removed. Then, as shown in FIG. 2D, CMP is performed until the surface of first mask 202 made up of a silicon nitride film is exposed. After that, the silicon oxide film is etched to expose the silicon substrate surface in the area for alignment mark formation.

Figure 2E:
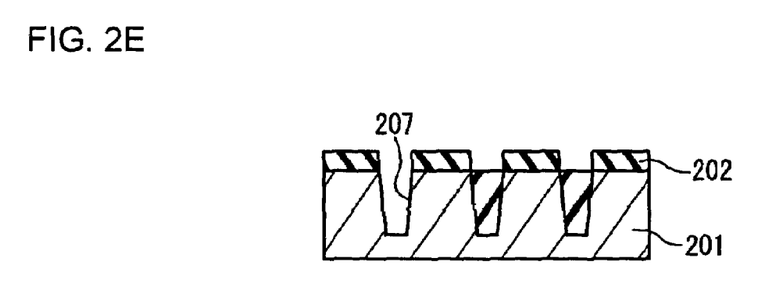
FIG. 2E illustrates the step following the step of FIG. 2D.

Next, as shown in FIG. 2E, the silicon substrate is etched to form trench 207 for alignment marks in the area for alignment mark formation.

Figure 2F:
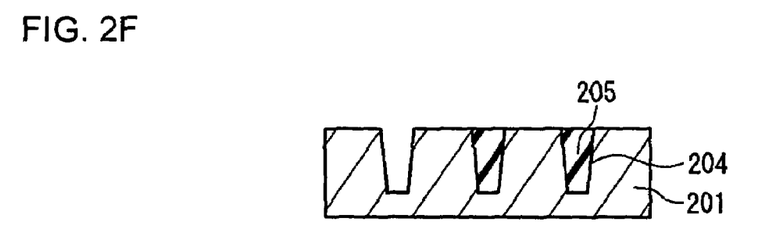
FIG. 2F illustrates the step following the step of FIG. 2E.

Next, as shown in FIG. 2F, silicon nitride film 202 is removed to form a flat-surface element-isolated wafer, whose surface has trench 207 for alignment marks.

In order to form a contact plug so as not to come into contact with wirings, it is desirable to restrain the expansion of the bore of the hole relative to the lithographed pattern at the etching step for forming a contact hole. Thus, it is desirable that the etching is to be proceeded vertically to the horizontal plane of the substrate according to the lithographed pattern and that etching in the horizontal direction of the lithographed pattern is to be restrained.

In order to form a small contact hole of 100 nm or less in bore while restraining the expansion of the bore of the hole relative to the lithographed pattern, dry etching is carried out under the following conditions.

Condition 1: A high ratio of selectivity relative to the resist mask

Condition 2: A rich variety of deposition seeds

Desirably, both these conditions may be satisfied.

However, under such conditions, the variety of deposition seeds becomes greater than that of etching seeds in the trench formation part where the area to be etched is large, and the etching is stopped as a consequence. As such, the phenomenon in which the etching rate in the larger area to be etched is lower than that in the smaller area to be etched is referred to as inverse micro loading.

Because of this phenomenon, in order to form small contact holes of 100 nm or less in bore and a trench of 1 μm or more in width to be formed over the same semiconductor substrate by the usual method of lithography, separate lithographic steps for forming resist masks having apertures corresponding the respective sizes have to be carried out. The resultant increase in the lithographic steps makes it difficult to enhance the productivity. It is therefore desired to work out a technique which enables small contact holes and a large trench to be formed in a fewer stages of processing.

SUMMARY OF THE INVENTION

An object of the present invention is to provide a technique which enables small contact holes and a large trench to be formed in a fewer stages of processing.

According to an aspect of the invention, there is provided a method of manufacturing semiconductor devices comprising the steps of:

preparing a semiconductor substrate over which a laminated structure comprising an insulating layer is formed;

forming over the insulating layer a resist mask comprising a first opening and a second opening which is greater in width than the first opening;

first etching using the resist mask to form a hole which corresponds to the first opening and penetrates the insulating layer and to form a first trench which corresponds to the second opening and is shallower than the hole;

forming a deposition film so as to fill the hole;

second etching to etch back the deposition film so that the insulating layer is exposed in the first trench and that the deposition film remains in the hole; and third etching using the resist mask and the remaining deposition film for masking to remove the insulating layer part exposed in the first trench so as to form a second trench penetrating the insulating layer.

According to another aspect of the invention, there is provided the semiconductor device manufacturing method described above, wherein the first etching is carried out under such conditions that an etching rate in the second opening is lower than an etching rate in the first opening.

According to another aspect of the invention, there is provided the semiconductor device manufacturing method described above, wherein the opening width of the first opening is 100 nm or smaller.

According to another aspect of the invention, there is provided the semiconductor device manufacturing method described above, wherein the opening width of the second opening is 1 μm or larger.

According to another aspect of the invention, there is provided the semiconductor device manufacturing method described above, wherein the opening width of the first opening is 100 nm or smaller and the opening width of the second opening is 1 μm or larger.

According to another aspect of the invention, there is provided the semiconductor device manufacturing method described above, wherein the step of the first etching, the step of forming the deposition film, the step of the second etching and the step of the third etching are carried out with the same reactive ion etching apparatus.

According to another aspect of the invention, there is provided the semiconductor device manufacturing method described above, wherein the step of the first etching, the step of forming the deposition film, the step of the second etching and the step of the third etching are carried out with the same reactive ion etching apparatus using a gas containing hydrocarbon fluoride.

According to another aspect of the invention, there is provided the semiconductor device manufacturing method described above, further comprising the steps of:

removing the deposition film and the resist mask;

forming a via plug by burying an electric conductor in the hole where the deposition film is removed; and conducting lithography utilizing the second trench as an alignment mark.

According to another aspect of the invention, there is provided the semiconductor device manufacturing method described above, wherein the laminated structure comprises a first inter-layer insulating film formed over the semiconductor substrate, a contact plug penetrating the first inter-layer insulating film, a second inter-layer insulating film formed over the first inter-layer insulating film, wirings formed over the second inter-layer insulating film and the insulating layer covering the wirings; and the hole penetrates between the wirings and reaches the contact plug.

The invention enables small holes and a large trench to be formed in the manufacture of semiconductor devices in a fewer stages of processing.

DETAILED DESCRIPTION OF THE PREFERRED EMBODIMENTS

An exemplary embodiment of the present invention will be described in detail below with reference to accompanying drawings.

Figure 3A:
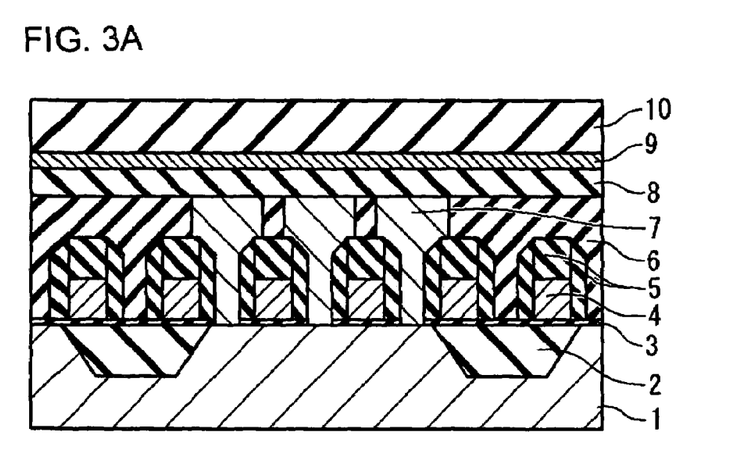
FIG. 3A illustrates a sectional structure cited to describe a manufacturing method in accordance with an exemplary embodiment of the present invention.
Figure 3B:
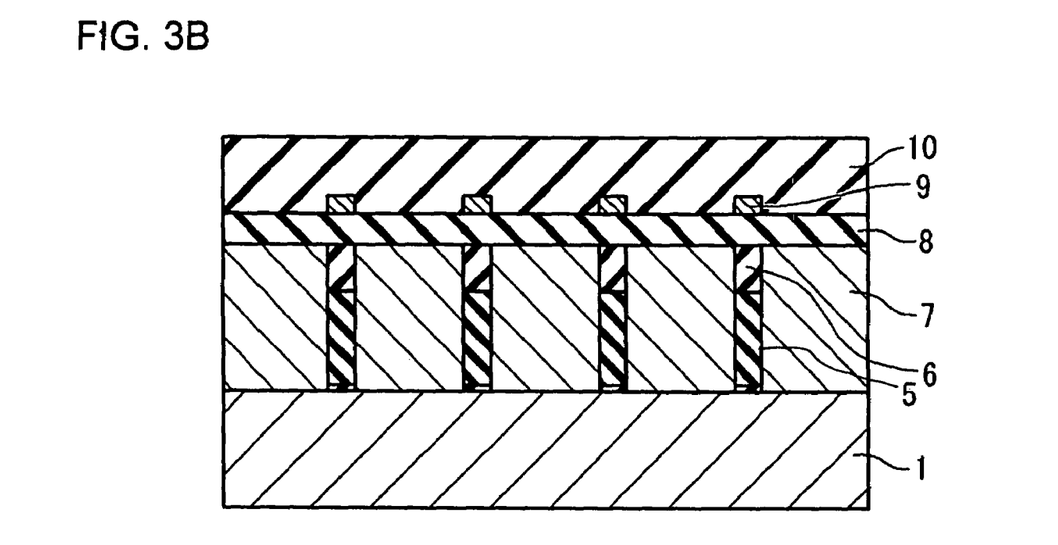
FIG. 3B illustrates another sectional structure cited to describe the manufacturing method in accordance with the foregoing exemplary embodiment.

FIG. 3A and FIG. 3B illustrate the sectional structure of the object to be worked upon in a method of manufacturing semiconductor devices in accordance with an exemplary embodiment of the present invention. In the sectional structure shown in FIG. 3A, the lengthwise direction of wiring 9 is parallel to the surface of the drawing, while the lengthwise direction of wiring 9 in the sectional structure shown in FIG. 3B is normal to the surface of the drawing. Although wiring 9 should not appear in FIG. 3A, wiring 9 is drawn for convenience of explanation. Although silicon nitride film 5 should not appear in FIG. 3B, silicon nitride film 5 is drawn for convenience of explanation.

The method of manufacturing semiconductor devices of this exemplary embodiment is applied to the object to be worked upon, which is shown in FIG. 3A and FIG. 3B.

The structure illustrated in FIG. 3A and FIG. 3B is fabricated in the following manner.

A p-type area and an n-type area formed by ion implantation, element isolating area 2, and a gate electrode structure including gate insulating film 3, gate electrode 4 and silicon nitride film 5, in a usual process, are formed over semiconductor substrate 1.

Then, interlayer insulating film 6 is so formed as to cover the gate electrode structure, and the surface of interlayer insulating film 6 is flattened.

Next, a first contact hole penetrating interlayer insulating film 6 is formed, and an electric conductor is buried in this hole to form first contact plug 7 to be connected to the diffusion layer of semiconductor substrate 1.

Then, insulating film 8 is formed over interlayer insulating film 6, and wiring 9 is formed over this insulating film 8. Next, inter-wiring layer insulating film 10 is formed over insulating film 8 and wiring 9, and the surface of this inter-wiring layer insulating film 10 is flattened. Typically, the thickness (depth) of wiring 9 is 50 nm, the width of wiring 9 is 50 nm, the space between wirings 9 (the typical distance between adjoining wirings 9) is 140 nm, and the thickness of wiring inter-wiring layer insulating film 10 is 200 nm.

Contact holes (second contact holes) and a large trench, greatly differing in opening size from each other, are formed in the structure formed in this way.

The second contact holes penetrate inter-wiring layer insulating film 10, and an electric conductor is buried in each of these holes to form a second contact plug. This second contact plug is connected to first contact plug 7, and is so formed as not to come into contact with wiring 9. In order to so form the second contact plug as not to come into contact with wiring 9, it is desirable to form a small bore hole by performing accurate anisotropic etching. More specifically, a lithographed pattern (resist mask) having openings of 100 nm or less in bore is formed, and dry etching is carried out under a condition which allows sufficient restriction of the expansion of the bore of the hole relative to the bore of the each opening of the lithographed pattern. It is preferable for this bore to be not less than 20 nm, more preferably not less than 40 nm, from the viewpoint of working ease and other considerations.

In the insulating layer in which the second contact holes are formed, a large trench of 1 μm or more in width is formed. This large trench is used for superposition and alignment at the subsequent lithographic step as alignment marks.

In order to form the small bore second contact holes of 100 nm or less while restraining expansion relative to the bore of the opening of the lithographed pattern, dry etching is carried out under a condition of a high ratio of selectivity relative to the resist mask and a rich variety of deposition seeds. Under such a condition, in etching the trench formation part whose area to be etched is larger, the variety of deposition seeds becomes greater than that of etching seeds, and the etching stops. If the variety of deposition seeds is reduced to etch the trench formation part whose area to be etched is larger, the ratio of selectivity relative to the resist mask decreases, and the bore of the second contact holes will become greater than the bore of the opening of the lithographed pattern.

If the etching for trench formation does not proceed sufficiently and a shallow trench is used for alignment marks, the superposition and alignment at the subsequent lithographic step will become difficult, making it difficult to achieve the desired level of product quality.

If holes of a greater bore than the bore of the opening of the lithographed pattern are formed in the etching to form the second contact holes, it will become difficult to maintain insulation between wiring 9 and the second contact, again making it difficult to achieve the desired level of product quality.

The step forming the second contact holes ("the minute holes" or "the small-bore holes") and the large trench, greatly differing in opening size from each other, will be described with reference to FIG. 4A through FIG. 9B. FIGS. 4A, 5A, 6A, 7A, 8A and 9A show the section of the area where the second contact holes are formed. FIGS. 4B, 5B, 6B, 7B, 8B and 9B show the section of the area where the large trench is formed. Wiring 9 is present near the area where the second contact holes are formed. No wiring 9 is present near the area where the large trench is formed.

Figure 4A:
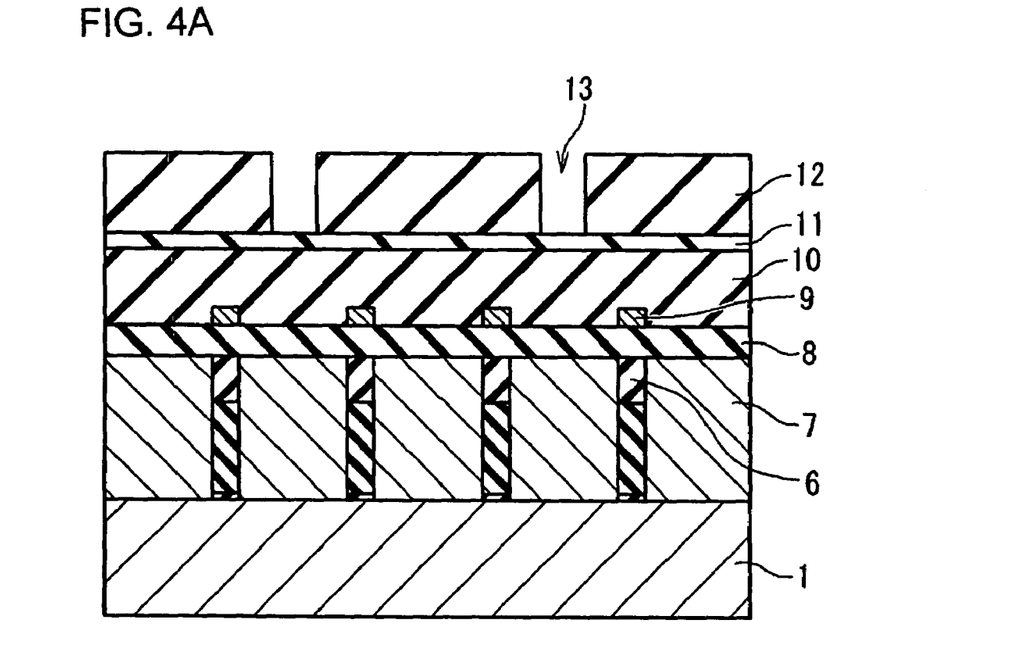
FIG. 4A illustrates a sectional structure after the step of lithography applied to an area where minute holes are to be formed, following the steps of FIGS. 3A and 3B.
Figure 4B:
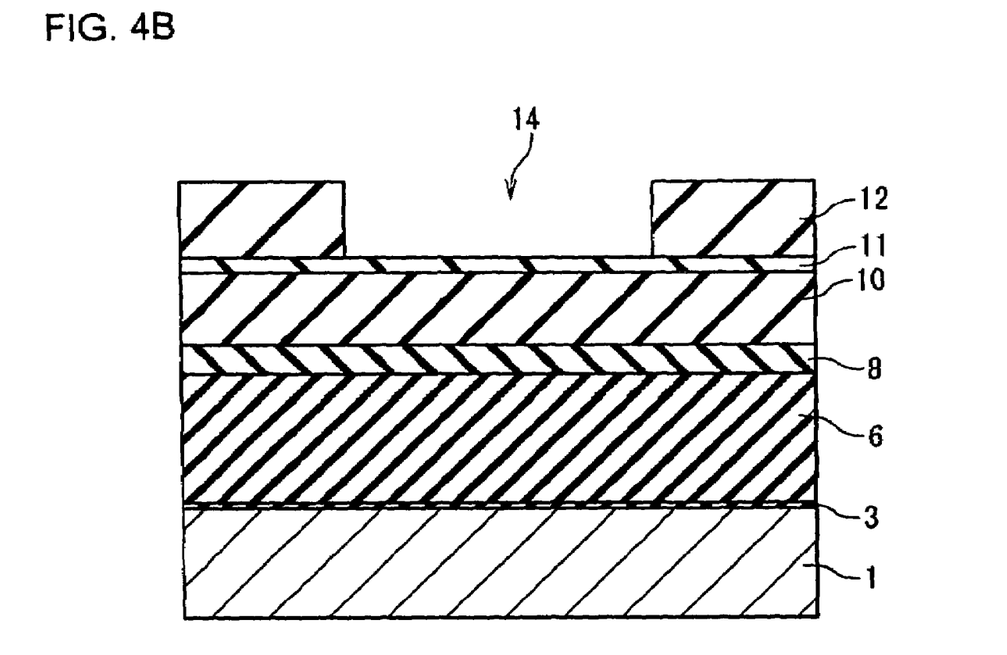
FIG. 4B illustrates a sectional structure after the step of lithography applied to an area where a large trench is to be formed, following the steps of FIGS. 3A and 3B.

FIGS. 4A and 4B illustrate a sectional structure after the steps of lithography applied to areas where second contact holes and a large trench are to be formed. This structure is formed as described below.

After the structure shown in FIGS. 3A and 3B are formed, anti-reflection film 11 made up of an organic substance is formed over inter-wiring layer insulating film 10. The thickness of anti-reflection film 11 is 50 nm. Patterned resist 12 is formed over anti-reflection film 11 by KrF exposure.

The film thickness of resist 12 is 450 nm. The opening size of small-diameter hole patterns 13, which are the openings in resist 12 for the formation of the second contact holes, is 100 nm. The opening width of large trench pattern 14, which is the opening in resist 12 for the formation of the large trench, is 1 µm or more.

Figure 5A:
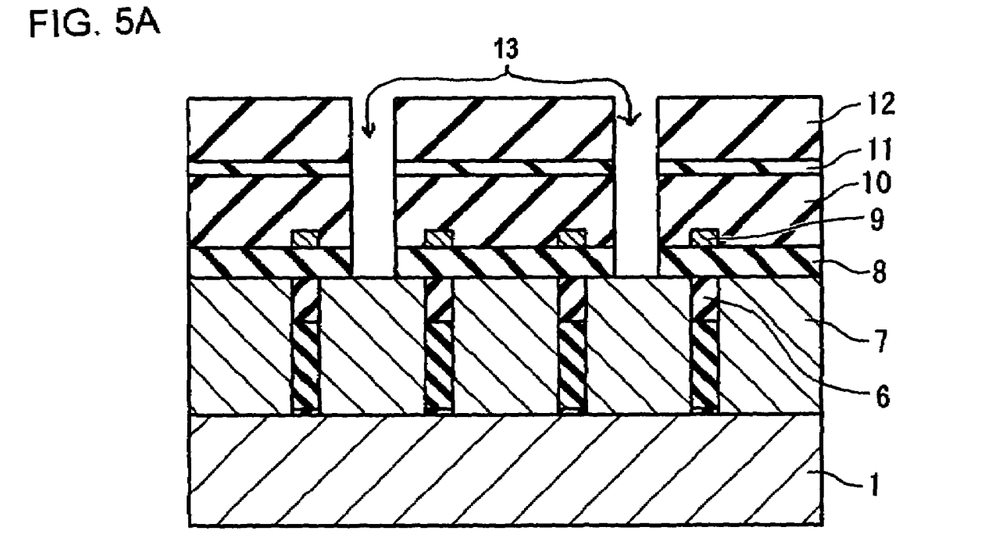
FIG. 5A illustrates a sectional structure after a first etching step applied to an area where minute holes are to be formed, following the steps of FIGS. 4A and 4B.
Figure 5B:
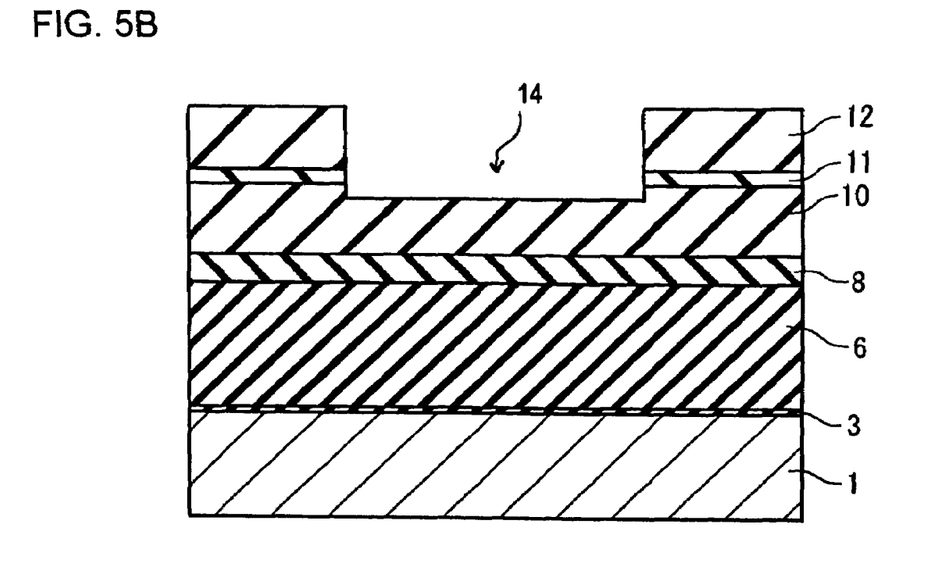
FIG. 5B illustrates a sectional structure after a first etching step applied to an area where a large trench is to be formed, following the steps of FIGS. 4A and 4B.

FIGS. 5A and 5B illustrate the sectional structure after a first etching step following the step of lithography. This structure is formed as described below.

As shown in FIG. 5A, in the positions in resist 12 corresponding small-diameter hole patterns 13, through holes penetrating organic anti-reflection film 11, inter-wiring layer insulating film 10 and insulating film 8 are formed. These through holes are so disposed between the wirings as not to let wiring 9 be exposed in the holes. At the bottom of each through hole, the surface of first contact plug 7 is exposed.

At the first etching step, etching is carried out under conditions of restraining expansion of the bore of the through holes relative to the bore of small-diameter hole patterns 13. These conditions are set as described below for instance. A two-frequency reactive ion etching (RIE) apparatus, in which RF power is applied to each of an upper electrode and a lower electrode where the wafer is placed, is used. The etching gases are $C_5F_8$, $O_2$ and Ar. The flow rates of the $C_5F_8$, $O_2$ and Ar gases are 30 sccm, 45 sccm and 400 sccm, respectively. The pressure is 25 mTorr. The RF power applied to the upper electrode is 2500 W, and that to the lower electrode, 3000 W. Since the ratio of selectivity relative to the resist under these conditions is about 5, a considerable length of time is required to etch anti-reflection film 11, which is made up of an organic matter, provided under the lower resist layer. This length of time is reduced by adapting the etching conditions for the etching of anti-reflection film 11. In etching the anti-reflection film, the flow rate of etching gas $O_2$ is increased, and $CF_4$ may be mixed into the etching gas.

As shown in FIG. 5B, a shallow trench is formed in the position in resist 12 corresponding large trench pattern 14. This shallow trench is formed by removing anti-reflection film 11 and the surface part of inter-wiring layer insulating film 10 by etching. When etching is carried out under the above conditions of restraining expansion of the bore of the holes, the conditions being suitable for the formation of minute holes, etching in large trench pattern 14 for alignment mark formation is stopped at a depth of about 50 nm.

Figure 6A:
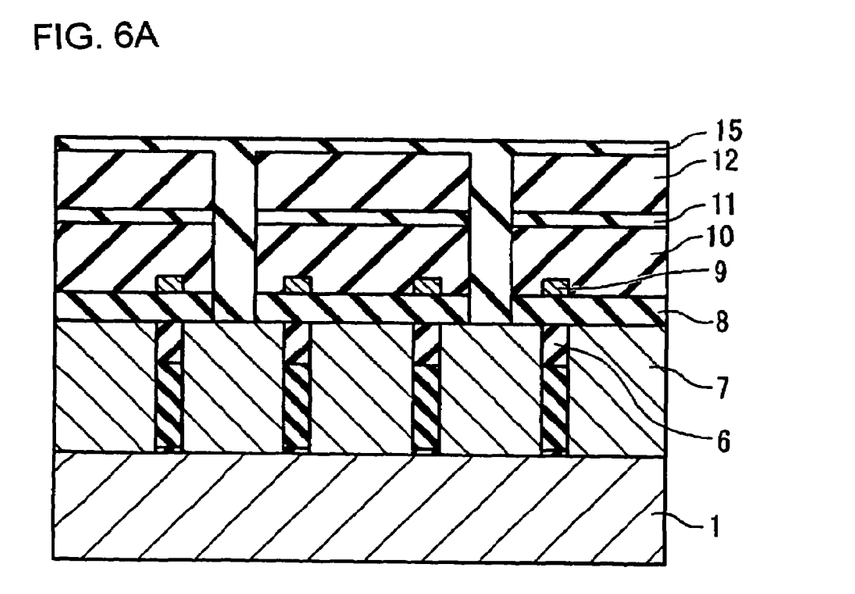
FIG. 6A illustrates a sectional structure after a deposition step applied to an area where minute holes are to be formed, following the steps of FIGS. 5A and 5B.
Figure 6B:
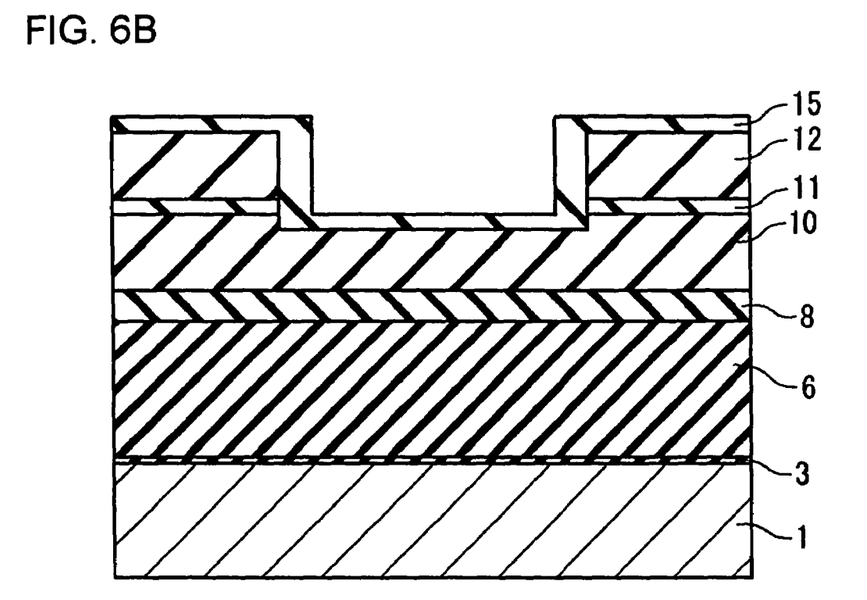
FIG. 6B illustrates a sectional structure after a deposition step applied to an area where a large trench is to be formed, following the steps of FIGS. 5A and 5B.

FIGS. 6A and 6B illustrate the sectional structure after the completion of a deposition step following the first etching step. This structure is formed as described below.

As shown in FIG. 6A, holes formed at the first etching step in positions corresponding small-diameter hole patterns 13 are filled with deposition film 15. The surface of deposition film 15 in the positions corresponding small-diameter hole patterns 13 and the surface of deposition film 15 in the positions corresponding resist 12 form substantially the same plane.

The deposition step is carried out under the following conditions. The deposition gases are $CH_3F$ and Ar. The flow rates of $CH_3F$ and Ar gases are 30 sccm and 400 sccm, respectively. The pressure is 25 mTorr. The RF power applied to the upper electrode is 2500 W, and that to the lower electrode, 500 W. The deposition rate is about 30 nm/min. The deposition rate is controllable according to the gas conditions and the RF power applied.

When deposition is carried out under these conditions, the opening of large trench pattern 14 is not filled with deposition film 15. That is, the surface of deposition film 15 over large trench pattern 14 is formed in a shape along the opening shape of large trench pattern 14 and the shallow trench.

Figure 7A:
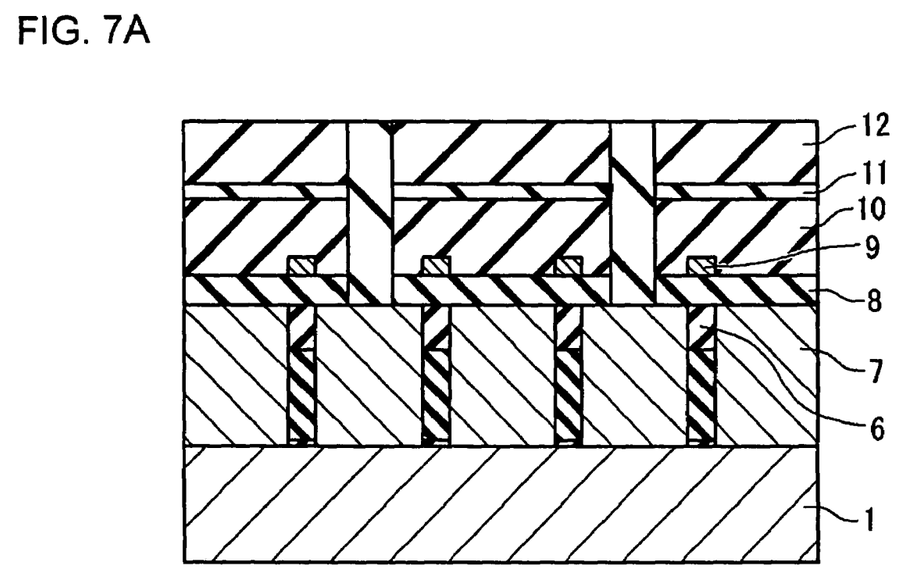
FIG. 7A illustrates a sectional structure after a second etching step applied to an area where minute holes are to be formed, following the steps of FIGS. 6A and 6B.
Figure 7B:
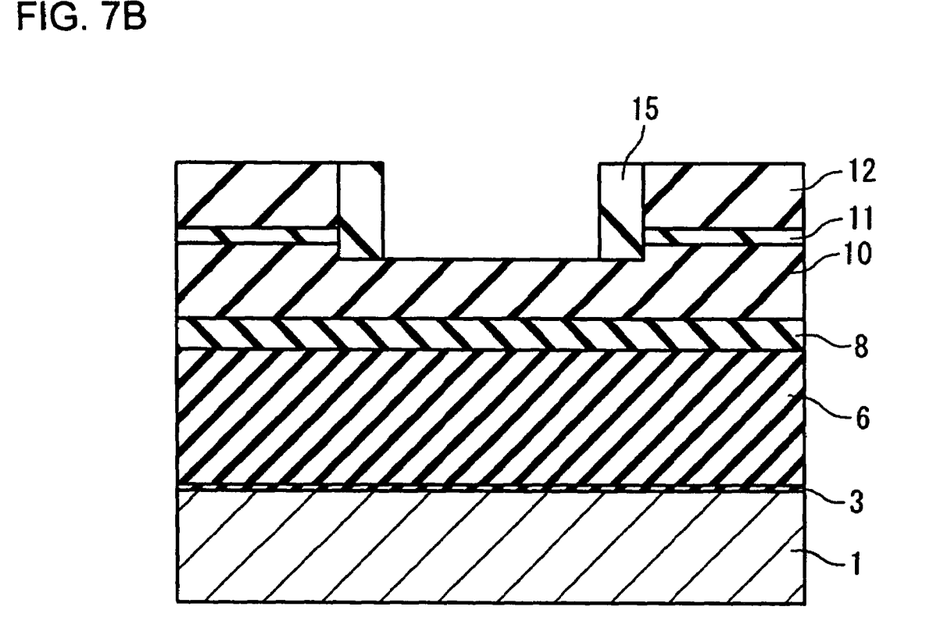
FIG. 7B illustrates a sectional structure after a second etching step applied to an area where a large trench is to be formed, following the steps of FIGS. 6A and 6B.

FIGS. 7A and 7B illustrate the sectional structure after the completion of a second etching step following the deposition step. This structure is formed as described below.

As shown in FIG. 7A, dry etching back is performed as the second etching step to remove deposition film 15 over resist 12 to expose the surface of resist 12. The parts of deposition film 15 buried in the holes formed at the positions corresponding small-diameter hole patterns 13 are not removed.

By this second etching step, deposition film 15 at the bottom of large trench pattern 14 is removed to expose inter-wiring layer insulating film 10 as shown in FIG. 7B. Further, deposition film 15 over resist 12 in the vicinities of large trench pattern 14 are removed. As a result, deposition film 15 remains on the side walls of large trench pattern 14.

This second etching step is carried out under the following conditions. The etching gas contains $O_2$, typically containing $CF_4$, $O_2$ and Ar. The flow rates of the $CF_4$, $O_2$ and Ar gases are 70 sccm, 30 sccm and 750 sccm, respectively. The pressure is 25 mTorr. The RF power applied to the upper electrode is 3000 W, and that to the lower electrode, 1000 W. Under these conditions, deposition film 15 formed at the bottom of large trench pattern 14 can be removed in a processing time of about 10 sec.

Figure 8A:
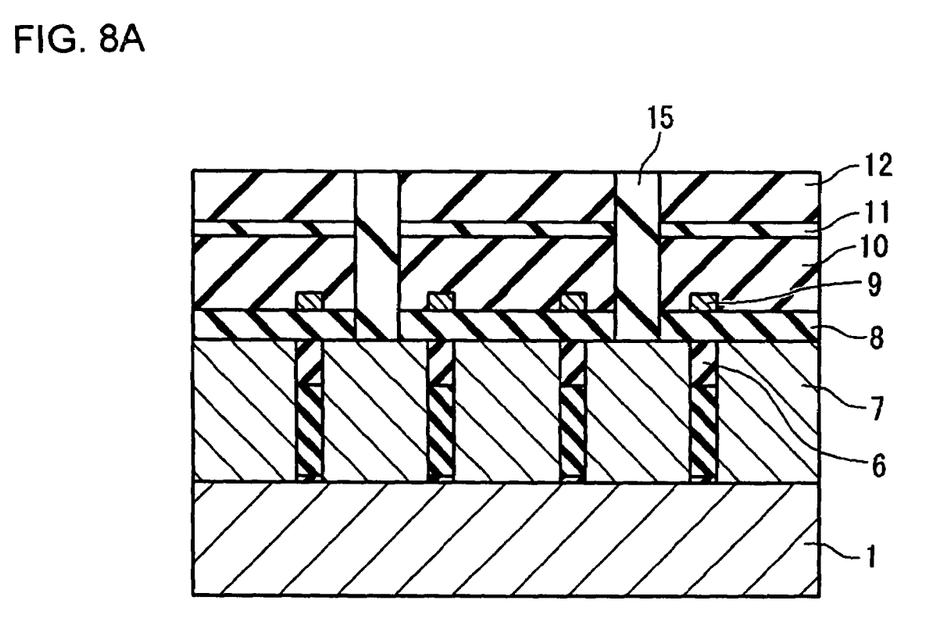
FIG. 8A illustrates a sectional structure after a third etching step applied to an area where minute holes are to be formed, following the steps of FIGS. 7A and 7B.
Figure 8B:
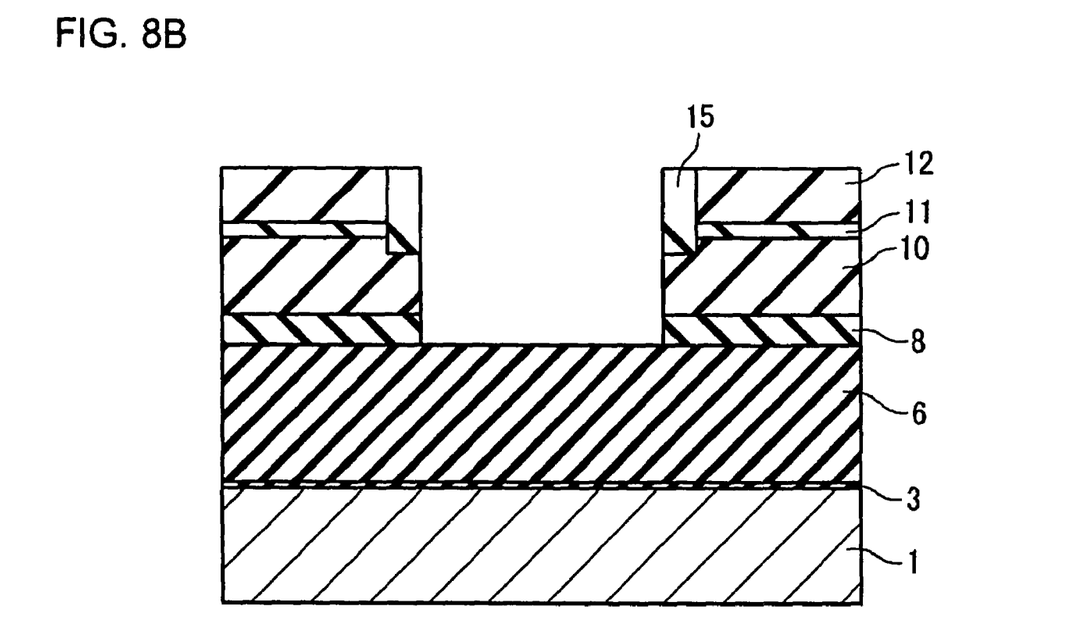
FIG. 8B illustrates a sectional structure after a third etching step applied to an area where a large trench is to be formed, following the steps of FIGS. 7A and 7B.

FIGS. 8A and 8B illustrate the sectional structure after the completion of a third etching step following the second etching step. This structure is formed as described below.

As shown in FIG. 8B, at the third etching step, the bottom of large trench pattern 14 where inter-wiring layer insulating film 10 is exposed by the second etching step is etched. The etching depth is as deep as required by the subsequent alignment. In the example shown in FIG. 8B, inter-wiring layer insulating film 10 and insulating film 8 in the positions corresponding large trench pattern 14 are removed to expose interlayer insulating film 6. In the area where small contact holes are to be formed, resist 12 and deposition film 15 buried in the hole at the positions corresponding small-diameter hole patterns 13 are left on the surface as shown in FIG. 8A.

The etching conditions are so set as to make the etching depth in large trench pattern 14 at the third etching step to be greater than at the first etching step. The etching depth in large trench pattern 14 at the third etching step is deep enough to allow the trench formed at this etching step to be used for alignment. It is preferable for this depth to be at least 200 nm or more, and the depth is appropriately set according to the lithography process to be subsequently accomplished along with the alignment using this trench.

To be more specific, the third etching step is carried out under the following conditions. The etching gas contains $C_5F_8$, $O_2$ and Ar. The flow rates of the $C_5F_8$, $O_2$ and Ar gases 30 sccm, 55 sccm and 400 sccm, respectively. The $O_2$ gas flow rate is set higher than at the first etching step. It is preferable for rare gas to be added, too. The pressure is 25 mTorr. The RF power applied to the upper electrode is 2500 W, and that to the lower electrode, 3000 W.

Figure 9A:
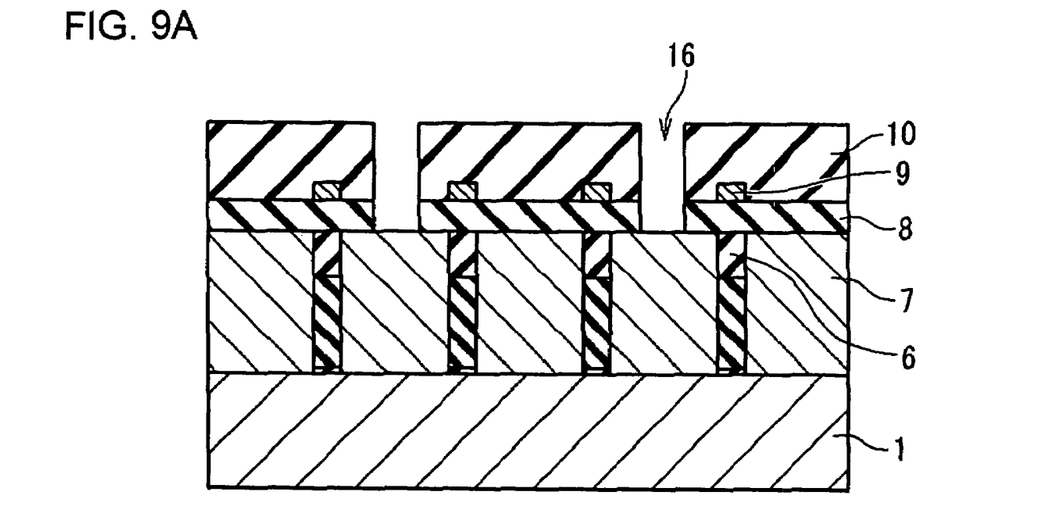
FIG. 9A illustrates a sectional structure after a removing step applied to an area where minute holes are to be formed, following the steps of FIGS. 8A and 8B.
Figure 9B:
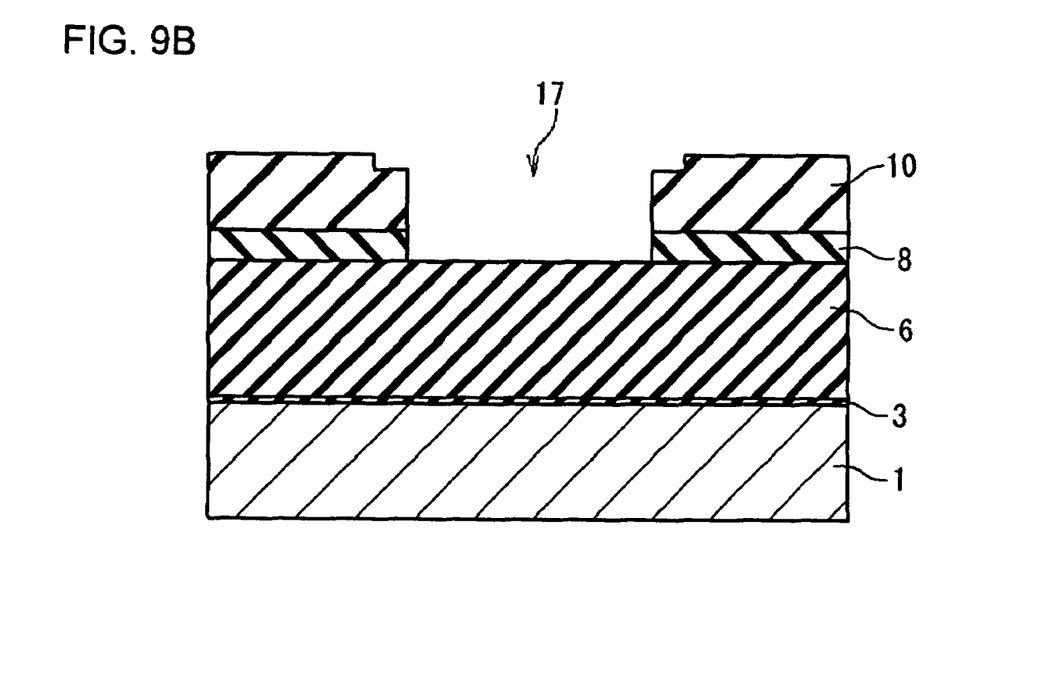
FIG. 9B illustrates a sectional structure after a step applied to an area where a large trench is to be formed, following the steps of FIGS. 8A and 8B.

FIGS. 9A and 9B illustrate the sectional structure after the completion of a removing step following the third etching step. This structure is formed as described below.

At this removing step, resist 12, anti-reflection film 11 and deposition film 15 are removed by ashing and wet cleaning.

As shown in FIG. 9A, portions of deposition film 15 filled in the through holes provided at the positions corresponding small-diameter hole patterns 13 are removed together with resist 12 and anti-reflection film 11 to form second contact holes 16. These second contact holes 16 open themselves in the surface of inter-wiring layer insulating film 10 and reach first contact plugs 7.

As shown in FIG. 9B, removal of resist 12, anti-reflection film 11 and deposition film 15 formed on the side wall of large trench pattern 14 results in formation of large trench 17.

The bore of second contact holes 16 in the part close to the surface of inter-wiring layer insulating film 10 is 100 nm. Large trench 17 measures 1 μm or more in opening width and has a sufficient depth for alignment.

The process hitherto described can be carried out by consecutive steps within the same chamber in the RIE apparatus. Thus, it is possible to form, in the same layer, holes of 100 nm or less in bore and a large trench of 1 μm or more in opening width for alignment marks by consecutive steps conducted in the same chamber.

Next, other applicable processing conditions than those exemplified in the foregoing description will be described. At the first etching step, it is possible to use carbon-rich gas, such as $C_4F_8$ or $C_4F_6$ in place of $C_5F_8$. With such gases as well, it is possible to achieve conditions which prevent etching from stopping in the formation of small-diameter holes and which stop etching where a large trench pattern for the formation of alignment marks is used.

At the deposition step, it is possible to form a deposition film by using a mixture gas of $CF_4$ and $H_2$ or $CH_2F_2$ gas in place of $CH_3F$.

At the third etching step, it is possible to achieve a sufficient etching depth in the large trench pattern by using some other gas than $C_5F_8$, such as $C_4F_8$ or $C_4F_6$, and increasing the flow rate of oxygen. Further with reference to the third etching step as described above, a case in which the oxygen flow rate is higher than that at the first etching step and other conditions are the same is presented. It is also possible to achieve a sufficient etching depth in the large trench pattern by mixing a less carbon-contained gas, such as $CF_4$ or $CHF_3$, instead of these conditions.

What is claimed is:

1. A method of manufacturing semiconductor devices comprising:
   preparing a semiconductor substrate over which a laminated structure comprising an insulating layer is formed;
   forming over the insulating layer a resist mask comprising a first opening and a second opening having a greater opening width than an opening width of the first opening;
   first etching using the resist mask to form a hole which corresponds to the first opening and penetrates the insulating layer and to form a first trench which corresponds to the second opening and is shallower than the hole;
   forming a deposition film such that said hole is filled;
   second etching to etch back the deposition film such that the insulating layer is exposed in the first trench and that the deposition film remains in the hole; and
   third etching using the resist mask and the remaining deposition film for masking to remove the insulating layer exposed in the first trench such that a second trench penetrating the insulating layer is formed.

2. The method of manufacturing semiconductor devices according to claim 1, wherein the first etching is carried out under such conditions that an etching rate in the second opening is lower than an etching rate in the first opening.

3. The method of manufacturing semiconductor devices according to claim 1, wherein the opening width of the first opening is 100 nm or smaller.

4. The method of manufacturing semiconductor devices according to claim 1, wherein the opening width of the second opening is 1 μm or greater.

5. The method of manufacturing semiconductor devices according to claim 1, wherein the opening width of the first opening is 100 nm or less, and wherein the opening width of the second opening is 1 μm or greater.

6. The method of manufacturing semiconductor devices according to claim 1, wherein the first etching, the forming the deposition film, the second etching, and the third etching are carried out with a reactive ion etching apparatus.

7. The method of manufacturing semiconductor devices according to claim 1, wherein the first etching, said forming the deposition film, the second etching, and the third etching are carried out with a reactive ion etching apparatus using a gas containing hydrocarbon fluoride.

8. The method of manufacturing semiconductor devices according to claim 1, further comprising:
   removing the deposition film and the resist mask;
   forming a via plug by burying an electric conductor in the hole where the deposition film is removed; and
   conducting lithography utilizing the second trench as an alignment mark.

9. The method of manufacturing semiconductor devices according to claim 1, wherein the laminated structure comprises:
   a first inter-layer insulating film formed over the semiconductor substrate;
   a contact plug penetrating the first inter-layer insulating film;
   a second inter-layer insulating film formed over the first inter-layer insulating film;
   wirings formed over the second inter-layer insulating film; and
   the insulating layer covering the wirings, and
   wherein the hole penetrates between the wirings and reaches the contact plug.

10. The method of manufacturing semiconductor devices according to claim 1, wherein said first trench is used to complete said second etching and said third etching.

11. A method of manufacturing semiconductor devices comprising:
   forming a resist film over an interlayer insulating film formed over a semiconductor substrate, the resist film patterned to form a first opening pattern for forming a contact hole and a second opening pattern for forming an alignment pattern, the second opening pattern having an opening size greater than an opening size of the first opening pattern;
   etching the interlayer insulating film, using the first opening pattern and the second opening pattern as mask, to simultaneously form the contact hole according to the first opening pattern and a first opening according to the second opening pattern, said contact hole and said first opening formed such that the contact hole penetrates the interlayer insulating film and that the first opening does not penetrate the interlayer insulating film;

forming a deposition film such that the contact hole is filled with the deposition film and that the deposition film is formed on a side wall in the first opening; and etching, at a bottom of the first opening, the interlayer insulating film not covered with the deposition film formed on the side wall in the first opening to form a second opening penetrating the interlayer insulating film.

12. The method of manufacturing semiconductor devices according to claim 11, wherein an opening width of the alignment pattern is ten times or more greater than an opening width of the contact hole.

13. The method of manufacturing semiconductor devices according to claim 11, further comprising:

removing the deposition film filling the contact hole and the deposition film remaining on the side wall in the first opening.

14. The method of manufacturing semiconductor devices according to claim 11, further comprising:

forming an anti-reflection film over the interlayer insulating film, wherein the resist film is formed over the anti-reflection film.

15. The method of manufacturing semiconductor devices according to claim 11, wherein the etching the interlayer insulating film for forming the contact hole and the first opening is carried out under such conditions that an etching rate in the first opening is lower than an etching rate in the contact hole.

16. A method of manufacturing semiconductor devices comprising:

forming a resist film over an interlayer insulating film formed over a semiconductor substrate, the resist film patterned to form a first opening pattern for forming a contact hole and a second opening pattern for forming a first opening, the second opening pattern having an opening width ten times or more greater than an opening width of the first opening pattern;

etching the interlayer insulating film, using the first opening pattern and the second opening pattern as a mask, to simultaneously form the contact hole according to the first opening pattern and the first opening according to the second opening pattern, said contact hole and said first opening formed such that said contact hole penetrates the interlayer insulating film and that the first opening does not penetrate the interlayer insulating film;

forming a deposition film such that the contact hole is filled with the deposition film and that the deposition film is formed on a side wall in the first opening; and etching, at a bottom of the first opening, the interlayer insulating film not covered with the deposition film formed on the side wall in the first opening to form a second opening penetrating the interlayer insulating film.

17. The method of manufacturing semiconductor devices according to claim 16, further comprising:

removing the deposition film filling the contact hole and the deposition film remaining on the side wall in the first opening.

18. The method of manufacturing semiconductor devices according to claim 16, further comprising:

forming an anti-reflection film over the interlayer insulating film, wherein the resist film is formed over the anti-reflection film.

19. The method of manufacturing semiconductor devices according to claim 16, wherein the etching the interlayer insulating film for forming the contact hole and the first opening is carried out under such conditions that an etching rate in the first opening is lower than an etching rate in the contact hole.

20. A method of manufacturing semiconductor devices comprising:

forming a resist film over an interlayer insulating film formed over a semiconductor substrate, the resist film patterned to form a first opening pattern and a second opening pattern, said second opening pattern having an opening size greater than an opening size of the first opening pattern;

etching the interlayer insulating film, using the first opening pattern and the second opening pattern and the second opening pattern as a mask, to simultaneously form a contact hole according to the first opening pattern and a first opening according to the second opening pattern, such that the contact hole penetrates the interlayer insulating film and that the first opening does not penetrate the interlayer insulating film;

forming a deposition film such that the contact hole is filled with the deposition film and that the deposition film is formed on a side wall in the first opening;

etching, at a bottom of the first opening, the interlayer insulating film not covered with the deposition film formed on the side wall in the first opening, to form a second opening penetrating the interlayer insulating film; and removing the deposition film filling the contact hole and the deposition film remaining on the side wall in the first opening.

21. The method of manufacturing semiconductor devices according to claim 20, further comprising:

forming an anti-reflection film over the interlayer insulating film, wherein the resist film is formed over the anti-reflection film.

22. The method of manufacturing semiconductor devices according to claim 20, wherein the etching for forming the contact hole and the first opening is carried out under such conditions that an etching rate in the first opening is lower than an etching rate in the contact hole.

* * * * *